(12) United States Patent
Driediger

(10) Patent No.: US 7,418,636 B2
(45) Date of Patent: Aug. 26, 2008

(54) ADDRESSING ERROR AND ADDRESS DETECTION SYSTEMS AND METHODS

(75) Inventor: Steve Driediger, Kanata (CA)

(73) Assignee: Alcatel Lucent, Paris (FR)

( * ) Notice: Subject to any disclaimer, the term of this patent is extended or adjusted under 35 U.S.C. 154(b) by 548 days.

(21) Appl. No.: 11/024,119

(22) Filed: Dec. 22, 2004

(65) Prior Publication Data

US 2006/0156154 A1    Jul. 13, 2006

(51) Int. Cl.
*G06F 11/00* (2006.01)
(52) U.S. Cl. .......................................... 714/53; 714/730
(58) Field of Classification Search ................... 714/53, 714/730
See application file for complete search history.

(56) References Cited

U.S. PATENT DOCUMENTS

| | | | | |
|---|---|---|---|---|
| 5,590,278 A | * | 12/1996 | Barthel et al. ................. | 714/53 |
| 6,094,732 A | * | 7/2000 | Takano ......................... | 714/53 |
| 6,269,458 B1 | * | 7/2001 | Jeter et al. .................... | 714/42 |
| 6,457,067 B1 | * | 9/2002 | Byers et al. ................... | 710/3 |
| 6,941,493 B2 | * | 9/2005 | Phelps ......................... | 714/53 |
| 2004/0162956 A1 | * | 8/2004 | Hidai et al. ................. | 711/164 |

OTHER PUBLICATIONS

Microsoft Computer Dictionary, 2002, Microsoft Press, 5th ed., pp. 142.*

* cited by examiner

*Primary Examiner*—Emerson C Puente

(57) ABSTRACT

Addressing error detection systems and methods are disclosed. A target address is written to a memory in an electronic system and subsequently output on an address path through which the memory is addressable. An addressing error is detected by determining whether the target address output on the address path is detected at the memory. Address detection at the memory involves storing the target address, monitoring the address path for the target address, and providing an address detection indication based on whether the target address is detected on the address path. The address detection indication may be provided, for example, by setting a flag in a data structure which is stored in the memory.

20 Claims, 4 Drawing Sheets

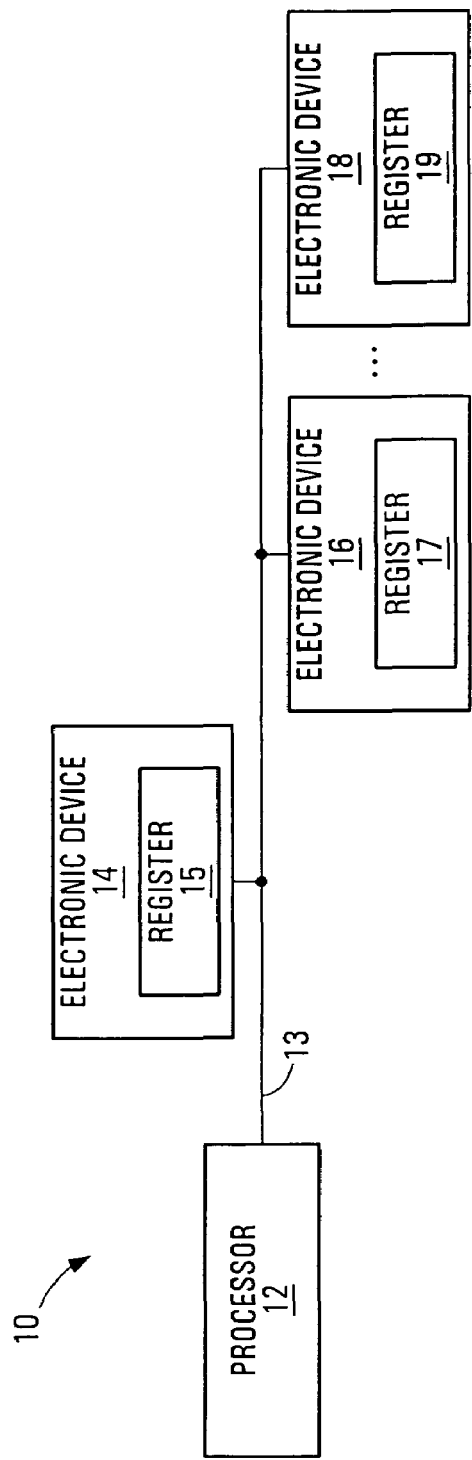
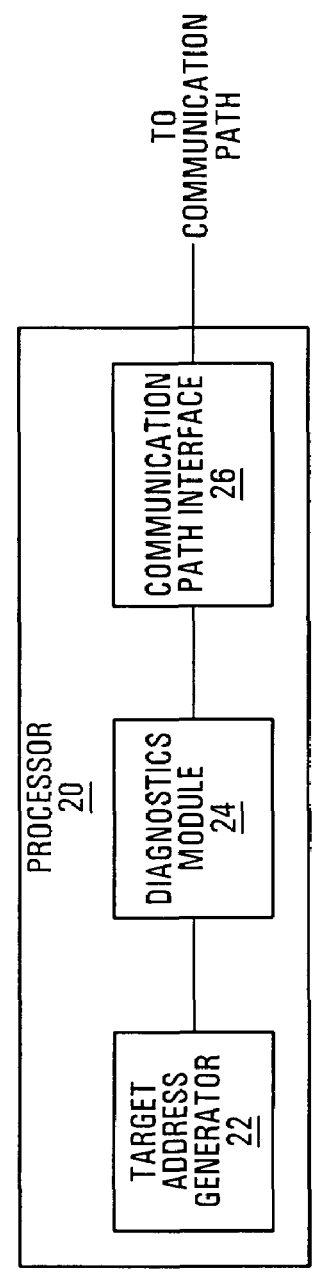
FIG. 1
FIG. 2

ADDRESSING ERROR AND ADDRESS DETECTION SYSTEMS AND METHODS

FIELD OF THE INVENTION

This invention relates generally to electronic systems and, in particular, to detecting addressing errors and addresses in electronic systems.

BACKGROUND

Traditionally, checking for addressing errors such as address bus errors in electronic systems has largely been a lower priority than checking for data errors. However, in an effort to pursue maximum system reliability and availability, with respect to so-called "5-9's" carrier grade targets for instance, the need to detect all types of electronic system errors, including addressing errors, has become more important.

According to one electronic system error detection technique, a microprocessor writes data to a scratch pad register and then reads data from the same scratch pad register to verify an error-free data path between the microprocessor and the scratch pad register. However, this technique itself is susceptible to undetected addressing errors, in that an addressing error may affect both a write address and a subsequent read address. Thus, an incorrect register might be addressed during both write and read operations. In this case, the addressing errors would not be detected by the microprocessor.

Although other error protection techniques such as parity may be used to provide a level of protection against addressing errors, many system bus protocols which are employed within or between electronic systems or components thereof lack this kind of protection.

SUMMARY OF THE INVENTION

In view of the foregoing, effective addressing error detection techniques for electronic systems are needed. There is a particular need for techniques to detect addressing errors in electronic systems having a shared bus architecture, such as communication equipment including packet switches or routers for instance and, more generally, computers.

According to one aspect of the invention, there is provided an addressing error detection system for detecting addressing errors in an electronic system. The addressing error detection system includes an interface to an address path and a data path which support communication with an addressable memory in the electronic system, and a processor coupled to the interface and configured to write a target address to the memory, to output the target address on the address path through the interface, and to detect an addressing error by determining whether the target address output on the address path is detected at the memory.

A method of detecting addressing errors in an electronic system is also provided, and includes writing a target address to an addressable memory in the electronic system, outputting the target address on an address path through which the memory is addressable, and detecting an addressing error by determining whether the target address output on the address path is detected at the memory.

A further aspect of the invention provides an address detection system for detecting addresses in an electronic system. The address detection system includes an interface for receiving a target address and an address of an addressable memory location, a memory device which includes the addressable memory location and is coupled to the interface for storing the target address in the addressable memory location, and an address match detector. The address match detector is coupled to the memory and to an address path through which the memory location is addressable, and is configured to monitor the address path for the target address and to provide an address detection indication based on whether the target address is detected on the address path.

A related method of detecting addresses in an electronic system includes receiving a target address and an address of an addressable memory location, storing the target address in the addressable memory location, monitoring an address path through which the memory location is addressable, and providing an address detection indication based on whether the target address is detected on the address path.

Another aspect of the invention provides a data structure stored on a machine-readable medium. The data structure includes an address field storing a target address, and a flag field storing a flag which indicates whether the target address has been detected on an address path by which medium is addressable.

Variations of the above aspects of the invention are also contemplated. For example, the operations of writing, outputting, and determining may be repeated at a processor for multiple target addresses. The corresponding operations of receiving, storing, and monitoring may also be repeated for multiple target addresses. The target addresses may include a series of target addresses having a walking ones pattern, a walking zeroes pattern, and a checker board pattern, for instance.

In some embodiments, an indication of the detection of an address on an address path is provided by setting a flag in the memory. This enables a determination to be made as to whether the target address has been detected at the memory by determining whether the flag has been set.

A tag value may also be sent to and stored in the memory. The tag value is transformed in a predetermined manner during storage to or retrieval from the memory. In this case, an addressing error is detected if the tag value has not been transformed in the predetermined manner.

Exchange of information with a memory may, in some embodiments, be accomplished through an alternate communication path which is separate from the address path, so that an address path under test is not relied upon during addressing error testing.

Other aspects and features of the present invention will become apparent to those ordinarily skilled in the art upon review of the following description of specific illustrative embodiments thereof.

BRIEF DESCRIPTION OF THE DRAWINGS

Examples of embodiments of the invention will now be described in greater detail with reference to the accompanying drawings, in which:

FIG. 1 is a block diagram of an electronic system in which embodiments of the invention may be implemented;

FIG. 2 is a block diagram of an illustrative example processor implementing an embodiment of the invention;

DETAILED DESCRIPTION OF PREFERRED EMBODIMENTS

Figure 3:
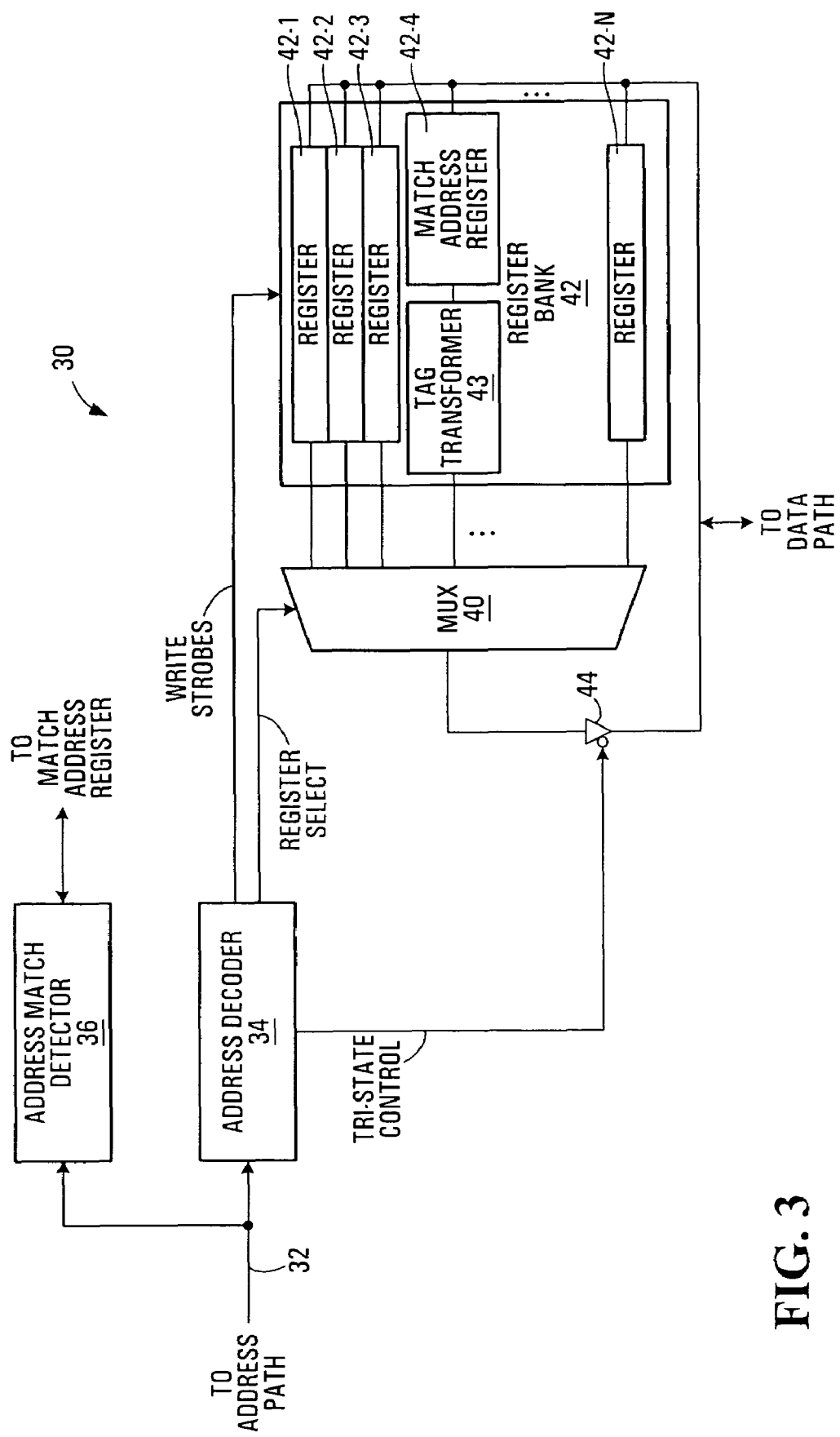
FIG. 3 is a block diagram of an address detection system according to an embodiment of the invention.

FIG. 1 is a block diagram of an electronic system 10 in which embodiments of the invention may be implemented. The electronic system 10 includes a processor 12 and electronic devices 14, 16, 18 connected by a shared communication path 13. Each electronic device 14, 16, 18, includes a register 15, 17, 19. An electronic system may include many more, or alternatively fewer, than the three electronic devices 14, 16, 18 shown in FIG. 1. Other types of electronic device and additional components may also be provided in an electronic system, but have not been shown in order to avoid congestion in the drawing. It should therefore be appreciated that the system 10 of FIG. 1, as well as the contents of the other drawings, are intended solely for illustrative purposes, and that the present invention is in no way limited to the particular example embodiments explicitly shown in the drawings and described herein.

The processor 12 may be, for example, a microprocessor, a microcontroller, or an Application Specific Integrated Circuit (ASIC) which controls operation of the electronic system 10. Examples of the electronic devices 14, 16, 18 include ASICs, Field Programmable Gate Arrays (FPGAs), Complex Programmable Logic Devices (CPLDs), and peripheral devices, which may be internal or external to an electronic system. The processor 12 communicates with the electronic devices 14, 16, 18 via the shared path 13, illustratively a system bus, which may have address, data, and control paths or portions. Each of these paths may include one or more signal lines which support communication between the processor 12 and the electronic devices 14, 16, 18.

In a preferred embodiment, the shared path 13 is a parallel path which provides an address bus which is separate from a data bus. However, other embodiments of the invention are also contemplated. For example, parallel information may be serialized before transfer over a typical, non-multiplexed address/data bus. In this case, an embodiment of the invention might be useful to provide fault coverage of a pre-serialized interface.

Signals on the data and address lines, or more generally data and address paths, of the communication path 13 are typically read in parallel to form "words". In the case of a data path, the words include data or instructions, and in the case of an address path, the words are addresses to registers or memory of the electronic devices 14, 16, 18. The control signals normally act individually, illustratively as read or write enable signals, to the electronic devices 14, 16, 18.

Errors can occur on any of the signals carried by the path 13. The possible causes of such errors include noise, electrical short or open circuits on the path 13 itself, and faults in drivers and receivers in the electronic devices 14, 16, 18.

In one conventional electronic system, the registers 15, 17, 19 are scratch pad registers. As described briefly above, a known method of checking for errors in the data lines of a system bus involves the processor 12 writing to, and then reading from, the scratch pad register in a given electronic device to verify an error-free data path from the processor 12 to the device.

Strategic positioning of scratchpad registers within the address space can provide some address fault detection. For example, respective scratchpad registers may be implemented at addresses 0x5555 . . . 5 and 0xAAAA . . . A. Assuming that the difference between a scratchpad and non-scratchpad register can be recognized, which is not always the case, this will allow some addressing error protection. However, the protection is not as thorough as that provided by embodiments of the invention, and the fault isolation capability is limited.

According to an embodiment of the invention, addressing errors are detected on the path 13. The error detection techniques disclosed herein may be particularly useful in electronic systems which lack address parity to protect an address path or bus. As discussed in detail below, each of the registers 15, 17, 19 is or includes a match address register. A target address is stored in the match address register of an electronic device, by background diagnostics being executed by the processor 12, for example.

The match address register thereafter monitors address path activity for an occurrence of the target address, responsive to which a flag in the register is preferably set. The background diagnostics drive the target address on the address path and check the flag to confirm detection of the target address by the match address register. The target address can be varied, according to standard bit-error testing patterns for instance, to thoroughly check for addressing errors to bit-level granularity. Since the match address register merely "listens" to address path activity, normal operations of the electronic system may be carried out concurrently with addressing error checking. Further embodiments of the invention provide alternatives for ensuring the integrity of communications with the match address register, such as use of a tag field, or alternatively an out of band channel.

The processor 12 is thus preferably configured, by executing software stored in a memory (not shown) for instance, to determine a target address and to write the target address to a particular one of the registers 15, 17, 19 via the path 13. The target address may be the actual address of the particular register 15, 17, 19, an address associated with the electronic device 14, 16, 18 which incorporates the register or another addressable component such as another register of the electronic device, or a test address, for example. References to target addresses should be interpreted accordingly.

Each of the registers 15, 17, 19 is uniquely addressable on the path 13. In order to write the target address to a particular register 15, 17, 19, the processor 12 outputs the address of the register on an address path of the communication path 13, the target address on a data path of the path 13, and in many implementations a write command on a control path of the path 13. It should be noted that the target address is to be stored in the register at this point and therefore is output on a data path, not on an address path. After the target address has been written to the register 15, 17, 19, the processor 12 outputs the target address on the address path and then determines whether the target address was correctly recognized by the register 15, 17, 19 or the electronic device 14, 16, 18 in which the register resides. This determination may be made, for example, by reading a flag from the register, as described in further detail below.

If the processor 12 determines that a target address asserted on the address path was not correctly recognized at an electronic device 14, 16, 18, then an addressing error has occurred, and an indication of an addressing error may be provided. An error indication may include an alarm signal or error message, for example, responsive to which further testing or corrective actions may be initiated automatically or by an operator or service personnel. Information regarding the tested register and possibly the target address which was used to test the register may also be provided in an error indication. The error indication preferably does not rely on the tested address path.

A determination by the processor 12 that the target address was correctly recognized at the register to which it was written indicates that the address path is operating correctly for the particular bit combination of the target address. The processor 12 may then continue addressing error checking using one or more different target addresses. A series of target addresses according to a predetermined bit pattern variation sequence may be used to test for faults or errors on different address lines of an address path or for different types of fault or error. For example, a target address sequence may include commonly used memory testing patterns, such as walking ones, walking zeroes, checker board, etc.

In some embodiments, the processor 12 may proceed to perform a complete testing cycle using a series of target addresses even if an addressing error is detected for one target address. Other target addresses in the series may allow an identification of one or more particular address lines or a type of fault which may be causing the detected addressing error.

The processor 12 preferably repeats the above operations for each of the registers 15, 17, 19 periodically, according to a predetermined schedule, or responsive to user inputs for instance. The particular register being tested and the target address currently being used are preferably tracked by the processor 12. This tracking may involve storing in a memory at the processor 12 an address or other identifier of a register under test or an electronic device in which the register resides and a current target address or an identifier thereof.

Register and target address tracking may also be useful in managing concurrent addressing error cycles for multiple registers. For example, the processor 12 may refer to tracking records to determine which target address or addresses should be asserted on the address path of the communication path 13, and which registers should recognize each target address.

FIG. 2 is a block diagram of an illustrative example processor 20 implementing an embodiment of the invention. The processor 20 implements a target address generator 22, a diagnostics module 24, and a communication path interface 26 for connection to address, data, and possibly control paths, such as address, data, and control lines of an electronic system bus.

As will be apparent to those skilled in the art, at least the target address generator 22 and the diagnostics module 24 may be implemented in software which is executed by the processor 20. The communication path interface 26 will often include drivers and receivers which may similarly be implemented in software. These drivers and receivers may send signals to and receive signals from address, data, and possibly control pins on a processor chip, for example.

The target address generator 22 generates one or more target addresses to be used in verifying address path functionality. Target address generation may be accomplished in many different ways, such as by storing target addresses including commonly used test data patterns in a memory. In this case, the target address generator 22 represents a memory access function. According to another approach, the target address generator 22 is an "active" component which generates one or more target addresses. In one embodiment, the target address generator 22 generates target addresses in response to requests for target addresses from the diagnostics module 24.

The diagnostics module 24 obtains target addresses from the target address generator 22, writes the target addresses to registers through the interface 26, outputs the target addresses on an address path through the bus interface 26, and determines whether the register to which each target address was written correctly recognized the target address on the address path. Failure to recognize the target address on the address path indicates that an addressing error has occurred.

The target address generator 22 or the diagnostics module 24 may also provide a tracking function as described above, by maintaining a mapping table in a memory to map registers under test and corresponding target addresses which are currently being used to test addressing for the registers.

In a preferred embodiment, addressing error detection is a background diagnostic operation which does not significantly impact normal operations of a processor or an electronic device. Thus, the processor 20 of FIG. 2 need not be a dedicated processor and may implement other components and functions than those explicitly shown. The processor 20 may also execute operating system software, for example, and support other types of communications via the interface 26.

It is also possible to divide addressing error checking functions differently than shown in FIG. 2. Target address generation, for example, may be performed by diagnostics software instead of by a separate target address generator. Embodiments of the invention may therefore include fewer components than shown in FIG. 2.

The present invention is also not limited to implementation using a processor. The components shown in FIG. 2 may be implemented separately, in respective hardware components.

Various functions involved in embodiments of the invention and performed at a processor-side of an address path have been described above. FIG. 3 is a block diagram of an address detection system for implementation at an electronic device according to another embodiment of the invention.

The system 30 includes an address decoder 34 and an address match detector 36 coupled to an address path 32. The address decoder 34 is also coupled to a register bank 42 which includes registers 42-1 through 42-N, a multiplexer 40, and a control terminal of a tri-state buffer 44. The address match detector 36 is coupled to one or more match address registers, one of which is shown at 42-4, in which a target address is written. It will also be apparent to those skilled in the art that an electronic device incorporating the system 30 may include further interface components than the address decoder 34, such as drivers and receivers, for connection to address, data, and control paths.

The basic structure and operation of a register system including an address decoder 34, a tri-state buffer 44, a multiplexer 40, and a register bank 42 is well understood in the technical field to which the present invention relates. An address received on the address path 32 is decoded by the address decoder 34. For a read operation, the one of the registers 42-1 through 42-N in the register bank 42 which corresponds to the received address is selected using the MUX 40, the tri-state buffer 44 is placed in its low impedance state, and data stored in the register is output to a data path. A write operation is substantially similar, although register selection is accomplished through a write strobe instead of a MUX.

Conventional register systems, however, do not include an address match detector 36, which may be implemented in hardware, using a comparator for instance, or in software for execution by a processor. When a target address has been written to a match address register 42-4 in the register bank 42, the address match detector 36 compares each address on the address path 32 with the target address in the match address register 42-4. If a match between the address on the address path 32 and the target address in the match address register 42-4 is detected, then the address match detector 36 provides an indication of the detection, preferably by setting a flag in the match address register 42-4. A processor may then determine whether the target address had been detected by accessing the match address register 42-4, and in particular by determining whether the flag is set.

Figure 4:
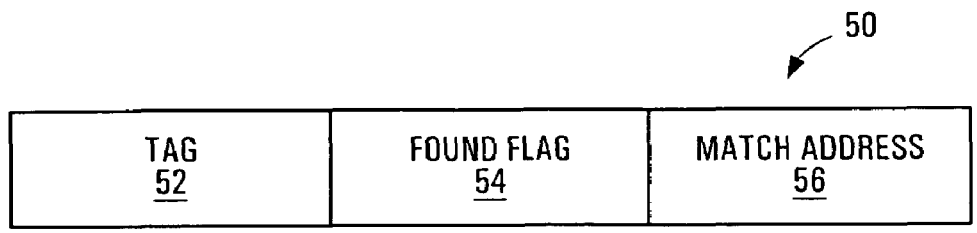
FIG. 4 is a block diagram of a data structure according to a further embodiment of the invention.

FIG. 4 is a block diagram of a data structure according to a further embodiment of the invention. The data structure 50 represents an example of a record in which information may be stored in a match address register 42-4 of the register bank 42.

The data structure 50 includes a tag field 52, a found flag field 54 for storing a flag which is set when a target address is detected on an address path, and a match address field 56 for storing the target address. The use of the found flag field 54 and the match address field 56 in accordance with embodiments of the invention will be apparent from the foregoing. The tag field 52 is described in further detail below.

The "tag" field 52 is included in the match address register record 50 to provide a further indication of the integrity of the target address which is sent to the match address register. The tag stored in the tag field 52 may be an arbitrary binary word selected by the diagnostic software or component performing the addressing error checking.

The match address register preferably has a unique capability with respect to other types of registers in an electronic device or system in that it inverts or otherwise transforms the tag in a predetermined manner before writing it to the tag field 52. Alternatively, the match address register 42-4 could transform the tag when the tag field is read. In the system 30, the latter function is provided by the tag transformer 43, which may include inverters to invert a tag value which is read from the match address register 42-4, for instance.

Although shown in FIG. 3 as being within the register bank 42, the tag transformer 43 may be implemented as a separate external component. The tag transformer 43 also need not necessarily be implemented on a read side the match address register 42-4 as shown. It may instead be implemented on the write side of the match address register 42-4. That is, the tag value that is written to the match address register 42-4 may be either stored and inverted when it is read, or inverted before it is stored. In the latter case, the inverted tag value is returned when the match address register 42-4 is read.

When the match address register contents are read to check the found flag, the value stored in the tag field 52 is also preferably checked to verify that it is the inversion of the selected tag which was sent to the match address register. Since the match address register is the only register in the system that inverts this portion of stored data (i.e., the bits assigned to the tag field 52), an error detection system can be assured that it has reached a match address register when it reads the tag field 52.

In some electronic systems, different numbers of address lines and data lines are provided in a system bus, with the number of address lines often being greater than the number of data lines. In this case, a single target address may be divided into multiple registers or memory locations.

The target address may be divided into portions corresponding to the number of data lines, with the portions being written to respective match address registers via multiple write operations. Each write operation preferably specifies a different address, starting with an address of a primary match address register in which a first portion of the target address is stored and proceeding with addresses of one or more secondary match address registers.

Alternatively, all write operations in which portions of the same target address are being written may specify the same address, an address for a primary match address register for instance. Writing of portions of the target address into multiple match address registers is then managed at an electronic device. In this scheme, an electronic device may simply write portions of a target address into consecutive registers in a register bank. Another option would be to have the electronic device form a linked list type of data structure by including, in each match address register which is used to store a portion of a target address, a pointer to or address of a match address register which stores the next portion of the target address.

Address detection in conjunction with multiple match address registers proceeds substantially as described above, with the exception that the contents of multiple match address registers would be concatenated or otherwise combined for comparison with addresses observed on an address path. Each match address register which is used to store a target address may also include a found flag, or a portion thereof in the case of a multi-bit flag, which is set when the target address is detected. Any match address register may then be accessed to determine whether the target address was detected. However, a single found flag, in the primary match address register for example, would also provide an indication of target address detection while occupying less storage space in the case of a single-bit flag and requiring only one flag to be set in one register upon address detection.

As described above, a tag which is transformed by a match address register during either a read operation or a write operation may be employed to provide an indication that a target address was properly stored in a match address register and not another type of register in an electronic device or system. Where a target address is divided among several match address registers, each match address register preferably includes a tag field.

The techniques described above may provide for detection and isolation of address faults down to per-bit granularity. However, effective addressing error detection is dependent upon proper access to a memory, illustratively a match address register. It may therefore be desirable to improve an addressing error detection system's tolerance to address faults when accessing the match address register. The following represent examples of measures which could be used to improve this tolerance in some embodiments of the invention:

1. Improve tolerance to address bus open circuits by using input pull-ups/downs on the address bus of an electronic device to "default" bus accesses to the primary address match register;
2. Improve tolerance to address bus shorts by using an "all zeroes" or "all ones" address for the primary address match register; and
3. Improve tolerance to addressing errors by allowing the address match register to alias to as many unused address locations as possible.

Other variations of the systems described above are also contemplated. The tag field and the tag inversion function of the match address register in accordance with an embodiment of the invention, for example, provide a mechanism whereby an addressing error detection system may determine whether a match address register is being accessed. An alternate communication path such as an out of band channel which supports communication with an electronic device or memory is another example of a mechanism which may improve reliability and integrity of communications between an addressing error detection system and the electronic device or memory. The alternate communication path is distinct from a communication path which is normally used for communication with an electronic device or register, and thus might not be subject to the same disturbances or faults as the normal communication path.

The alternate communication path is preferably used to send the target address to an electronic device or memory, and may also be used to read contents of the memory. However, the target address is subsequently asserted on a normal address path and the electronic device monitors the normal address path for the target address, as described above, so as to check for errors on the normal address path.

In one possible implementation, separate interfaces and signal lines are provided to support the alternate communication path. In FIG. 2, for example, a further interface may be coupled to the diagnostics module 24 for writing the target address to a memory. An additional interface to the register bank 42 may similarly be provided in the system 30 of FIG. 3.

Thus, the alternate communication path approach provides a distinct path for transferring target addresses, at the cost of additional interfaces and signal lines. The tag and inversion approach avoids the additional hardware, but increases the amount of information which is transferred between an addressing error detection system and any electronic devices, and also relies on the normal communication path.

Figure 5:
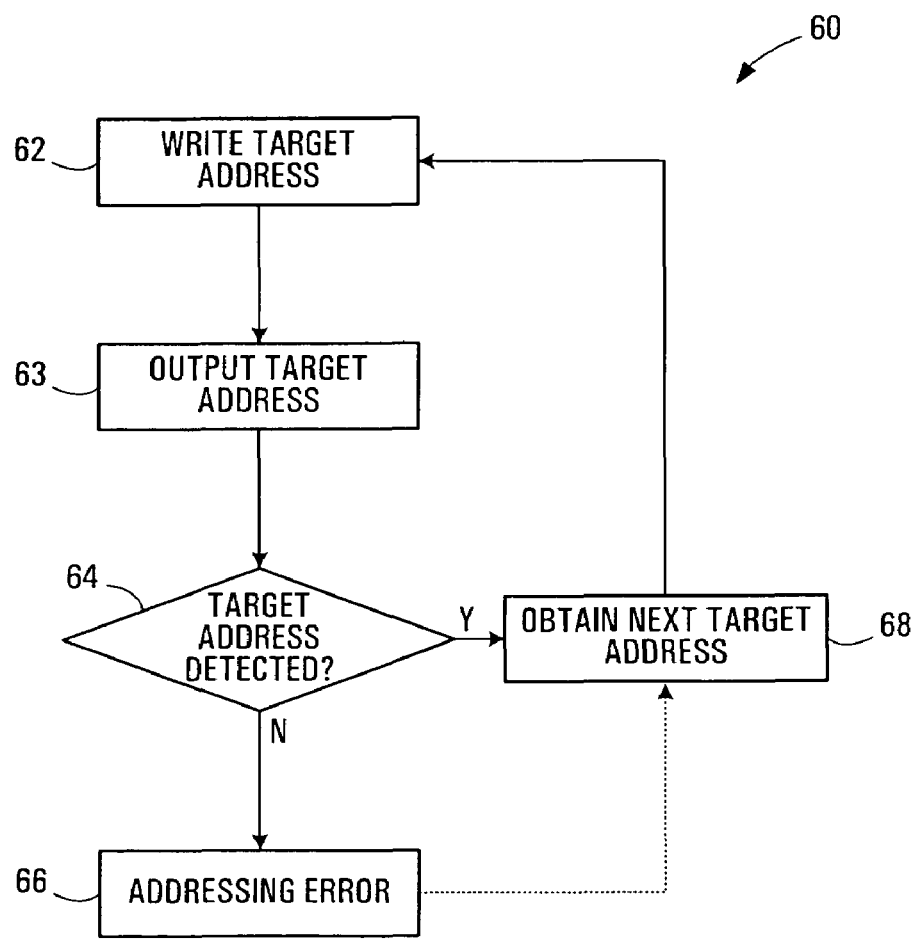
FIGS. 5 and 6 are flow diagrams of methods in accordance with still further embodiments of the invention.
Figure 6:
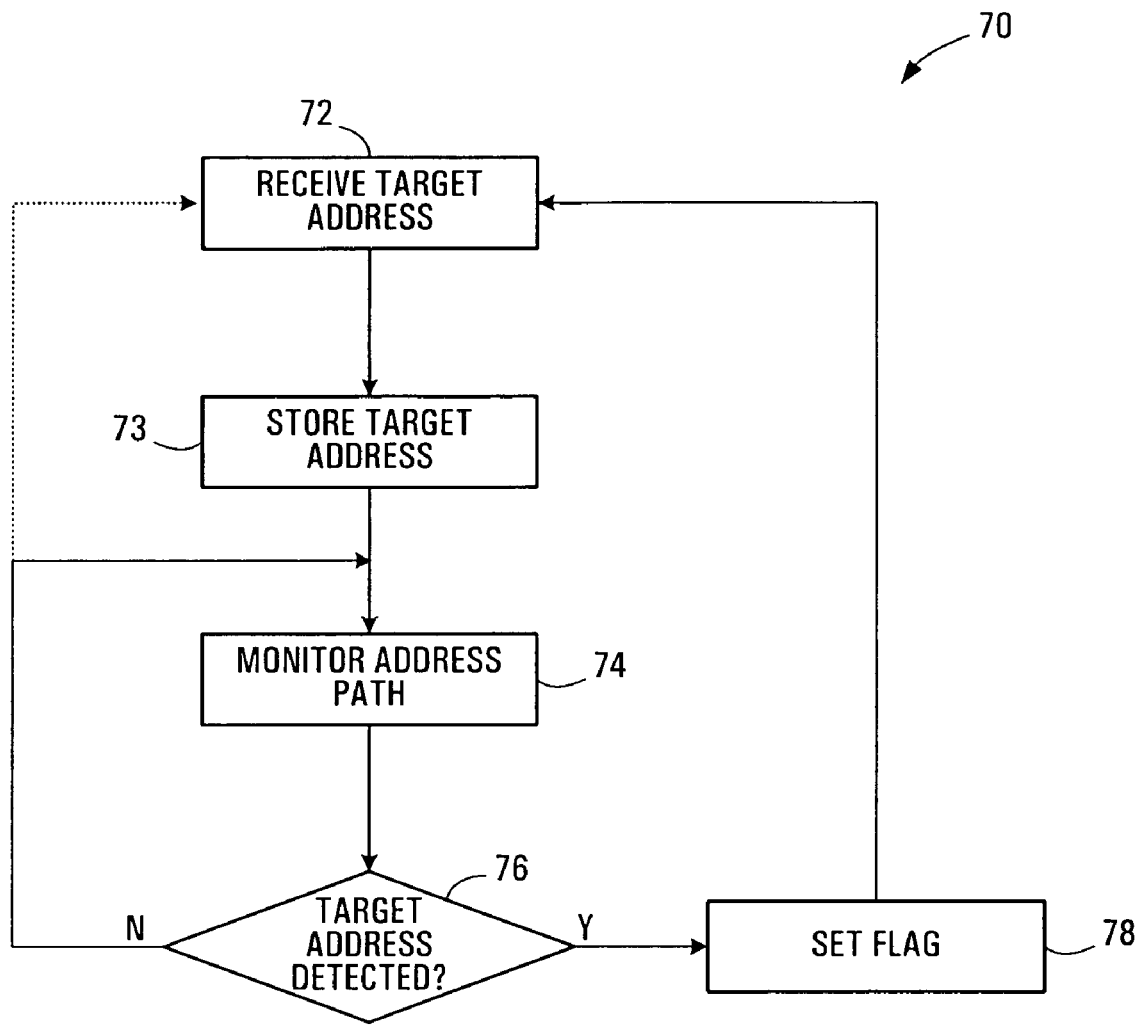

Embodiments of the invention have been described above primarily in the context of addressing error detection systems and address detection systems. FIGS. 5 and 6 are flow diagrams of methods in accordance with further embodiments of the invention. The operations shown in FIGS. 5 and 6 will be apparent from the foregoing system descriptions and therefore are described relatively briefly below.

A method of detecting addressing errors in an electronic system is shown in FIG. 5. The method 60 begins at 62 with writing a target address to an addressable memory in the electronic system. The target address is then output at 63 on an address path through which the memory is addressable. At 64, a determination is made as to whether the target address output on the address path is detected at the memory. An addressing error is detected, as indicated at 66, where the target address is not detected.

If the address path is operating properly, then the target address would be detected. The method may proceed at 68 to obtain a next target address in a series of target addresses used to verify operation of the address path, and the method is repeated for the next target address. As described above and indicated by the dashed line in FIG. 5, an addressing error checking cycle may also continue at 68 if a current target address was not detected.

FIG. 6 illustrates a method of detecting addresses in an electronic system. The method 70 begins when a target address is received at 72. The target address is stored at 73 at an addressable memory location which is received along with the target address. At 74, an address path through which the memory location is addressable is monitored. If the target address is detected on the address path, as determined at 76, then an address detection indication is provided at 78. As shown, the address detection indication may be provided by setting a flag. The method 70 may be repeated when another target address is received at 72.

In the event that the target address is not detected on the address path, then monitoring of the address path may continue at 74. The address path may be monitored at 74 for a predetermined amount of time or until either the target address is detected or another target address is received at 72, for instance.

Various mechanisms for performing the operations shown in FIGS. 5 and 6, as well as further operations which may be performed during addressing error checking and address detection will be apparent from the foregoing description of addressing error detection systems and address detection systems.

The addressing error and address detection techniques as disclosed herein are substantially unobtrusive to normal operation of an electronic system. After a match address register has been loaded with a target address, normal system operation can be conducted while the match register monitors activity on an address path for the target address. Further to being unobtrusive, the operation of "outputting" a target address can be accomplished by reading a register at that target address. This is harmless to the system, provided registers with any read side-effects are avoided in target addresses.

The use of a series of target addresses in an addressing error testing cycle also provides addressing error detection to bit-level granularity.

What has been described is merely illustrative of the application of principles of the invention. Other arrangements and methods can be implemented by those skilled in the art without departing from the scope of the present invention.

For example, according to embodiments of the invention described above, a target address is asserted on an address path by an addressing error detection system. However, a target address may be a test address or an actual address by which an electronic device, memory, or other component in an electronic system is addressable. In the latter case, the addressing error detection system may itself detect assertion of the target address on an address path during normal operations of the electronic system and then determine whether the target address was correctly detected by each match address register to which it had been written. Target address assertion is thereby incorporated into normal system operations, further reducing the impact of addressing error checking on normal operations.

Operations performed at a memory or electronic device may also include more "active" operations than those described above, such as sending an address detection indication to a processor. Once a target address has been written to a memory and output on an address path, the processor then need only monitor for an indication from the memory, instead of again accessing the memory, to determine whether the target address was detected. The address detection indication could be provided by a memory or electronic device by echoing a detected target address on the address path, outputting a next target address in a series of target addresses on the address bus, or providing some other predetermined response, such as a response on a dedicated pin which could either interrupt a processor or be polled by the processor, when a target address is detected.

An addressing error would then be declared if no address detection indication is received within a response time period after a target address has been output on the address path. In this case, the address detection indication may also includes an indication of the memory, illustratively its actual address or some other identifier, so that a processor can determine which memory detected the target address. Otherwise, the embodiments described in detail above, in which a memory is first written to and then read, may be preferred to provide a level of assurance that the correct memory recognized the target address.

In addition, although described primarily in the context of methods and systems, other implementations of the invention are also contemplated, as instructions stored on a machine-readable medium, for example.

I claim:

1. An addressing error detection system for detecting addressing errors in an electronic system, the addressing error detection system comprising:
   an interface to an address path and a data path which support communication with an addressable memory in the electronic system;

a processor coupled to the interface and configured to write a target address to the memory, the target address thus being stored in the memory, to output the target address on the address path through the interface, and to detect an addressing error by determining whether the target address output by the processor on the address path is detected on the address path at the memory.

2. The addressing error detection system of claim 1, wherein the processor is further configured to repeat the operations of writing, outputting, and determining for each of a plurality of target addresses.

3. The addressing error detection system of claim 1, wherein the memory comprises a memory of an electronic device in the electronic system, the electronic device being configured to monitor the address path for the target address and to set a flag in the memory responsive to detecting the target address on the address path, and wherein the processor is configured to determine whether the target address output on the address path is detected at the memory by determining whether the flag has been set in the memory.

4. The addressing error detection system of claim 1, wherein:
the processor is further configured to write a tag value to the memory;
the tag value is transformed at the memory in a predetermined manner during storage to or retrieval from the memory; and
the processor is further configured to retrieve the tag value from the memory, and to detect an addressing error by determining whether the tag value has been transformed in the predetermined manner.

5. The addressing error detection system of claim 1, further comprising:
a further interface to an alternate communication path which supports communication with the memory,
wherein the processor is coupled to the further interface and configured to write the target address to the memory through the further interface and to determine whether the target address output on the address path is detected at the memory by accessing the memory through the further interface.

6. A method of detecting addressing errors in an electronic system, the method comprising:
writing a target address to an addressable memory in the electronic system, the target address thus being stored in the memory;
outputting the target address on an address path through which the memory is addressable; and
detecting an addressing error by determining whether the target address output on the address path is detected on the address path at the memory.

7. The method of claim 6, further comprising:
repeating the writing, outputting, and determining for each of a plurality of target addresses.

8. The method of claim 6, wherein the memory comprises a memory of an electronic device in the electronic system, the electronic device being configured to monitor the address path for the target address and to set a flag in the memory responsive to detecting the target address on the address path, and wherein determining comprises determining whether the flag has been set in the memory.

9. The method of claim 6, further comprising:
writing a tag value to the memory, the tag value being transformed at the memory in a predetermined manner during storage to or retrieval from the memory;

retrieving the tag value from the memory; and
detecting an addressing error by determining whether the tag value has been transformed in the predetermined manner.

10. The method of claim 6, wherein:
the electronic system comprises a communication path comprising the address path and an alternate communication path which supports communication with the memory;
the writing comprises writing the target address to the memory through the alternate communication path; and
the determining comprises accessing the memory through the alternate communication path.

11. An address detection system for detecting addresses in an electronic system, the address detection system comprising:
an interface for receiving a target address and an address of an addressable memory location;
a memory device comprising the addressable memory location and coupled to the interface for storing the received target address in the addressable memory location; and
an address match detector, coupled to the memory device and to an address path through which the addressable memory location is addressable, and configured to monitor the address path at the memory device for the target address stored in the addressable memory location and to provide an address detection indication based on whether the target address stored in the addressable memory location is detected on the address path at the memory device.

12. The address detection system of claim 11, wherein the address match detector is configured to provide the address detection indication by setting a flag in the addressable memory location where the target address stored in the addressable memory location is detected on the address path at the memory device.

13. The address detection system of claim 12, wherein the target address and the address of the addressable memory location are received from a processor, and wherein the processor is configured to output the target address on the address path, and to subsequently access the flag to determine whether the target address output by the processor on the address path was detected on the address path at the memory device by the address match detector.

14. The address detection system of claim 11, wherein the interface further receives tag value for storage in the addressable memory location, and wherein the memory device transforms the tag value in a predetermined manner during storage to or retrieval from the addressable memory location.

15. The address detection system of claim 11, wherein the interface comprises an interface to an alternate communication path which supports communication with the memory device, the alternate communication path being distinct from the address path.

16. An electronic system comprising:
a plurality of electronic devices, each of the electronic devices comprising an address detection system for detecting addresses in the electronic system, the address detection system of each electronic device comprising:
an interface for receiving a respective target address and an address of a respective addressable memory location;
a memory device comprising the addressable memory location and coupled to the interface for storing the received target address in the addressable memory location; and an address match detector, coupled to the memory device and to an address path through which the addressable memory location is addressable, and configured to monitor the address path at the memory device for the target address stored in the addressable memory location and to provide an address detection indication based on whether the target address stored in the addressable memory location is detected on the address path at the memory device; and a processor configured to send to each of the plurality of electronic devices the respective target address and the address of the respective addressable memory location, to output each target address on the address path, and to determine, based on the indication provided by the address match detector of each of the plurality of electronic devices, whether each target address output by the processor on the address path is detected on the address path by the electronic device to which it was sent.

17. A method of detecting addresses in an electronic system, the method comprising:

receiving a target address and an address of an addressable memory location in a memory device;

storing the received target address in the addressable memory location;

monitoring, at the memory device, an address path through which the addressable memory location is addressable; and providing an address detection indication based on whether the target address stored in the addressable memory location is detected on the address path at the memory device.

18. The method of claim 17, wherein the providing comprises setting a flag in the addressable memory location where the target address stored in the addressable memory location is detected on the address path at the memory device.

19. The method of claim 18, wherein the receiving comprises receiving the target address and the address of the addressable memory location from a processor, further comprising, at the processor:

outputting the target address on the address path; and accessing the flag to determine whether the target address output by the processor on the address path was detected on the address path at the memory device.

20. The method of claim 17, further comprising:

receiving a tag value for storage in the addressable memory location; and transforming the tag value in a predetermined manner during storage to or retrieval from the addressable memory location.

* * * * *